(12) United States Patent
Zenge

(10) Patent No.: US 8,848,993 B2
(45) Date of Patent: Sep. 30, 2014

(54) METHOD AND DEVICE TO GENERATE MR IMAGES BASED ON MR DATA ENTERED IN THREE-DIMENSIONAL K-SPACE

(71) Applicant: Michael Zenge, Nuremberg (DE)

(72) Inventor: Michael Zenge, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 57 days.

(21) Appl. No.: 13/677,563

(22) Filed: Nov. 15, 2012

(65) Prior Publication Data

US 2014/0133716 A1    May 15, 2014

(30) Foreign Application Priority Data

Nov. 15, 2011    (DE) .......................... 10 2011 086 401

(51) Int. Cl.
G06K 9/00 (2006.01)
G06T 11/00 (2006.01)
A61B 5/05 (2006.01)

(52) U.S. Cl.
CPC .................................... *G06T 11/003* (2013.01)
USPC ............................ 382/128; 382/154; 600/410

(58) Field of Classification Search
USPC ......... 382/100, 103, 106–107, 128–134, 154, 382/168, 173, 181, 193, 232, 254, 274, 276, 382/285–291, 305, 312; 600/410; 324/310, 324/312, 307; 378/4, 21
See application file for complete search history.

(56) References Cited

U.S. PATENT DOCUMENTS

| | | | | |
|---|---|---|---|---|
| 6,281,681 | B1* | 8/2001 | Cline et al. ..................... | 324/310 |
| 7,719,270 | B2* | 5/2010 | Krueger ........................ | 324/307 |
| 7,853,060 | B2* | 12/2010 | Schmitt et al. ................ | 382/128 |
| 2008/0021303 | A1* | 1/2008 | Krueger ........................ | 600/410 |
| 2011/0095762 | A1* | 4/2011 | Piccini et al. ................. | 324/312 |

OTHER PUBLICATIONS

D.R. Fowler et al.: A Collision-based Model of Spiral Phyllotaxis; Proceedings of SIGGRAPH 1992, in: Computer Graphics, Jul. 1992, ACM SIGGRAPH, NY, pp. 361-368.
Helmut Vogel: A Better Way to Construct the Sunflower Head; Mathematical Biosciences 44:179-189 (1979); Elsevier North Holland, Inc.
Davide Piccini et al., Spiral Phyllotaxis: The Natural Way to Construct a 3D Radial Trajectory in MRI, Magnetic Resonance in Medicine, 66, 2011, pp. 1049-1056.
Candes et al. An introduction to compressive sampling IEEE signal processing magazine Mar. 2008 pp. 21-30.
Cline et al., Uniform K-Space Sampling with an Interleaved Fibonacci Spiral Acquisition General Electric Research and Development Center, Schenectady NY, 12309.
Michael Lustig et al: "Sparse MRI: The Application of Compressed Sensing for Rapid MR Imaging", Magnetic Resonance in Medicine 58; pp. 1182-1195, 2007.
Romberg, Imaging via Compressed Sampling (Introduction to compressive sampling and recovery via convex programming); IEEE Signal Processing Magazine; p. 14, Mar. 2008; pp. 14-20.

* cited by examiner

*Primary Examiner* — Seyed Azarian
(74) *Attorney, Agent, or Firm* — Schiff Hardin LLP

(57) ABSTRACT

In a method and a magnetic resonance (MR) system to generate MR images based on an MR measurement of the magnetic resonance system, MR data are acquired in three-dimensional k-space along straight lines proceeding in parallel. Each of these lines is defined by a point in a plane which intersects each line and that is situated orthogonal to each line. The points in the plane are arranged such that a distribution of the points obeys spiral phyllotaxis.

11 Claims, 4 Drawing Sheets

METHOD AND DEVICE TO GENERATE MR IMAGES BASED ON MR DATA ENTERED IN THREE-DIMENSIONAL K-SPACE

BACKGROUND OF THE INVENTION

1. Field of the Invention

The present invention concerns a method for data acquired and entered in three-dimensional k-space in an MR measurement by operation of a magnetic resonance system, as well as a correspondingly designed magnetic resonance system.

2. Description of the Prior Art

According to the prior art, a pseudo-random scanning and/or a "Poisson disk" scanning are used in MR imaging by means of compressed sensing. However, these scanning procedures can handle poorly in interleaved and/or segmented MR data acquisition since the scanning order to be maintained (i.e. the order in which the MR data are to be acquired) is difficult to define.

SUMMARY OF THE INVENTION

An object of the present invention is to generate MR images from a three-dimensional volume segment such that a compressed sensing of the volume segment is enabled, while the scan order to be maintained is simpler to define than is the case according to the prior art.

Within the scope of the present invention, a method is provided to create MR images based on an MR measurement with a magnetic resonance system. The MR data are acquired in three-dimensional k-space, which corresponds to a three-dimensional volume segment of an examination subject. The MR data are acquired along straight lines traveling in parallel in k-space. Each of these lines is defined by a point in a plane, wherein this plane intersects each of the lines and is situated perpendicularly to each of these lines. The points within the plane are arranged such that the points or the distribution of the points correspond to the spiral phyllotaxis, preferably the Fibonacci (spiral) phyllotaxis.

Phyllotaxis is the result of phyllotaxy or the leaf position in plants. Phyllotaxy is the arrangement of leaf-like organs in a plant. Leaf-like organs include leaves and carpels of a plant, for example the scales of a pine cone, the peel of a banana and the seeds in a sunflower blossom. The arrangement of the leaf-like organs according to phyllotaxis is frequently spiral-shaped, with the structure of these spirals obeying specific rules. These rules are defined according to the spiral phyllotaxis, for which "A Collision-based Model of Spiral Phyllotaxis", D. R. Fowler et al., Proceedings of SIGGRAPH 1992, in Computer Graphics, July 1992, ACM SIGGRAPH, New York, Pages 361-368 is referenced.

In spiral phyllotaxis, a divergence angle which has an arbitrary point relative to its predecessor point in the plane is always constant. The divergence angle is defined relative to a center point around which a spiral (which is formed by points) winds. Expressed differently, the divergence angle describes an angle that occurs at a center point in a triangle that is constructed from the point, its predecessor point and the center point.

In the present invention, the points lie in a plane. If the position of any one of these points is defined by means of polar coordinates (coordinate origin=a point in the plane that also lies on a middle axis of k-space that is situated perpendicularly to the plane), then—for the case that the points in the plane are arranged according to spiral phyllotaxis—it is the case that a difference angle between an angle of any one of these points and an angle of its predecessor point always has the same value or, respectively, is constant. The angle of the respective point is thereby the angle which this point has according to its polar coordinates. The difference angle can also be viewed as the divergence angle.

Fibonacci phyllotaxis is a special case of spiral phyllotaxis wherein the divergence angle in Fibonacci phyllotaxis corresponds to one of the golden angles (see Equations (1) and (2) below).

The radius of each point (distance of the point from the coordinate origin) thereby advantageously develops such that the radius grows continuously. Expressed in a different way: the radius of a point is always larger than the radius of its predecessor.

In this context, for better understanding of Fibonacci phyllotaxis reference can be made to "A Better Way to Construct the Sunflower Head, H. Vogel, Mathematical Biosciences 44: Pages 179-189, 1979.

Because the points for definition of the lines are arranged in the plane corresponding to spiral phyllotaxis (in particular corresponding to Fibonacci phyllotaxis), the distribution of the sample points is more uniform than is the case in other approaches. For example, eddy current effects which occur given gradient changes of the magnetic field of the magnetic resonance system can be reduced.

The small golden angle $\psi_1$ is defined according to the following Equation (1):

$$\Psi_1 = 360° - \frac{720°}{1+\sqrt{5}} \approx 137.5° \tag{1}$$

The large golden angle $\psi_2$ is defined according to the following Equation (2):

$$\Psi_2 = \frac{720°}{1+\sqrt{5}} \approx 222.5° \tag{2}$$

By the use of the golden angle, the next k-space line or, respectively, the intersection point of this k-space line with the plane falls in the largest gap within the already predetermined k-space lines or intersection points.

Spiral phyllotaxis is exceptionally suitable for an offset or segmented MR data acquisition.

According to an embodiment according to the invention, a grid exists in the plane which is orthogonal to each line and is intersected by each line. This grid has both first straight lines running in parallel in a first direction and second straight lines running in parallel in a second direction, wherein the first straight lines are orthogonal to the second straight lines. A first interval between adjacent first straight lines is thereby constant, and a second interval between adjacent second straight lines is likewise constant. A grid point of the grid respectively corresponds to an intersection point of one of the first straight lines with one of the second straight lines. A nearest grid point is determined for each point of the plane which corresponds to an intersection point of one of the lines. According to this embodiment, the corresponding line which forms the intersection point with the plane that corresponds to the point is shifted in a direction parallel to the plane, such that the line subsequently travels through this grid point or intersects this.

According to this embodiment, each line to be scanned accordingly, advantageously travels through a grid point of the grid network.

Two phase coding gradients and a frequency coding gradient are advantageously switched to acquire one of the lines. The two phase coding gradients thereby run orthogonal to one another in the plane which is respectively intersected by the scanned lines. The frequency coding gradient is situated orthogonal to both phase coding gradients, and therefore travels orthogonal to the plane, such that it runs parallel to the lines.

The MR images are advantageously generated with the use of an iterative reconstruction method. Iterative reconstruction methods can advantageously supplement missing or unacquired MR data via a prior knowledge of the MR image to be created. This prior knowledge can, for example, be the position and/or the dimensions of distinctive regions (blood vessels, for example) in the volume segment to be acquired. If it is known that this position and these dimensions of the regions (the blood vessels, for example) should only change a little in two MR images which represent adjacent slices within the volume segment, larger deviations from this position detected once or from the dimensions detected once can be penalized by a corresponding penalty term. With the aid of this penalty term, in the iterative reconstruction of the n-th MR image it is accordingly ensured that the currently reconstructed n-th MR image is not differentiated too strongly from the MR images reconstructed beforehand (before the n-th MR image).

According to the invention, compressed sensing can be used as a variant of the iterative reconstruction method. Compressed sensing is a statistical technique for data acquisition and data estimation which is intended to acquire or scan only comparably few measurement points in k-space. In spite of this, under certain conditions these measurement values sparsely acquired in k-space can reproduce nearly the entire information which, without the compressed sensing, can be reconstructed only via an acquisition of all measurement points in k-space. These conditions are satisfied in the generation of MR images when only slight differences occur between spatially adjacent MR images, and when the information to be acquired is concentrated in only a small portion of the image points (for example the image points which represent eh blood vessels), while the remaining image points have only a comparably low signal intensity.

By the use of an iterative reconstruction method, both the resolution and the signal-to-noise ratio of the MR images created according to the invention can be improved. Via the use of an iterative reconstruction method in comparison, the number and strength of artifacts can also be reduced in comparison to non-iterative methods. Moreover, the use of iterative reconstruction methods enables that only 50% of the lines in k-space must be acquired for example, without having to accept quality losses in the generated MR images in comparison to an MR data acquisition in which all lines in k-space are acquired.

The iterative reconstruction method that is used can employ a "sparsity" of relevant image information within the acquired MR data for the generation of the MR images.

It should be taken into account that this sparsity of the relevant image information within the acquired MR data can also be generated via a wavelet transformation, for example.

Due to the incoherency of the acquired k-space lines which are determined pseudo-randomly according to the invention, the artifacts likewise occur pseudo-randomly, and can therefore advantageously be detected and eliminated comparably well.

The k-space lines can be acquired in segments so that the k-space lines are scanned segment by segment. It is thereby advantageous for a number of segments to correspond to a Fibonacci number or a sum of two Fibonacci numbers. A Fibonacci number is an element of the Fibonacci sequence.

If the number of segments is selected such that this number corresponds to a Fibonacci number or a sum of two Fibonacci numbers, these segments are then arranged within the plane in the form of a spiral which winds from the inside outward.

According to a preferred embodiment according to the invention, the points in the plane with which the k-space lines are defined are calculated with the aid of polar coordinates or, respectively, circular coordinates, according to the following Equations (3) and (4).

$$R[i,j]=F_1\times(i+(j-1)\times S)^{(0.5+F_2)} \quad (3)$$

$$\phi[i,j]=(i+(j-1)\times S)\times \Psi \quad (4)$$

$R[i,j]$ and $\phi[i,j]$ respectively define the point $P[i,j]$ of those points in the plane with which the k-space lines are defined. $R[i,j]$ defines the radius based on a center point of the plane, wherein this radius indicates the distance of the point $P[i,j]$ from this center point. For the point $P[i,j]$, $\phi[i,j]$ indicates that angle which forms the radius $R[i,j]$ with the ray (for example the positive x-axis) which lies within the plane and intersects with the center point. The index i thereby indicates the corresponding segment, such that the index i runs from 1 up to the number of segments. The index j indicates the corresponding point within the segment, such that the index j runs from 1 up to the number of points of the i-th segment, wherein for the most part the number of points is the same for each segment.

$\Psi$ defines the small golden angle $\psi_1$ or the large golden angle $\psi_2$ as it is defined by Equation (1) or, respectively, (2).

S defines the number of segments by means of which the k-space lines are scanned. $F_1$ and $F_2$ are constants, wherein $F_1$ is determined depending on a Fibonacci number or a sum of two Fibonacci numbers. For example, $F_2$ can lie in a range $0<F_2<0.5$, such that $F_2=0.1$ is a good example of a value of the constant $F_2$.

The constant $F_1$ can be determined by the following Equation (5):

$$F_1 = \left(\frac{N}{B}\right)^{-(0.5+F_2)}, \quad (5)$$

N corresponds to the total number of all k-space lines that are circumscribed by an ellipse (in the plane) in k-space which, in the exemplary embodiment, is defined by the maximum radius in the respective direction in k-space. The real number B corresponds to an acceleration factor or an undersampling factor. A possible value for B is 4.5, for example.

Via Ny (the number of k-space lines in the y-direction) and by Nz (the number of k-space lines in the z-direction), N can be determined with rounding by the following Equation (6).

$$N = \Pi \times \frac{N_y}{2} \times \frac{N_z}{2} \quad (6)$$

Equations (3) through (5) describe a construction method with which all points (and therefore all k-space lines to be scanned) are defined by means of a closed formulation. Since this construction method also defines the points or, respectively, k-space lines of each segment, the sorting algorithms (which are complicated in part) —which, in the case of segmented MR measurements, are used in alternative sampling schemes, for example Poisson disc or random sampling—can be omitted.

Within the scope of the present invention, a magnetic resonance system is also provided to generate MR images based on an MR measurement of a magnetic resonance system. The magnetic resonance system thereby comprises a basic field magnet; a gradient field system; one or more RF antennas; and a control device in order to control the gradient field system and the one or multiple RF antenna(s) in order to acquire the measurement signals acquired by the RF antenna(s) in order to evaluate the measurement signals and in order to create the MR data from these. The magnetic resonance system acquires the MR data in three-dimensional k-space which corresponds to a three-dimensional volume segment of the examination subject from which the MR images are to be created. The magnetic resonance system acquires the MR data in k-space along straight lines traveling in parallel. Each of these lines is thereby defined by a point within a plane which is intersected by these lines and which is situated orthogonal to each line. The magnetic resonance system for data acquisition thereby arranges the points (and therefore the lines) in the plane such that a distribution of points obeys spiral phyllotaxis, and in particular Fibonacci phyllotaxis.

The advantages of the magnetic resonance system according to the invention essentially correspond to the advantages of the method according to the invention which have been described in detail in the preceding, such that a repetition is foregone here.

Furthermore, the present invention includes a non-transitory, computer-readable storage medium encoded with programming instructions that can be loaded into a memory of a programmable control device or a computer of a magnetic resonance system. All or various embodiments of the method according to the example that are described in the preceding can be executed when the programming instructions run in the control device. Program means such as libraries and auxiliary functions may be needed in order to realize the corresponding embodiments of the method. The programming instruction can be a source code (C++, for example) that must still be compiled and linked or that must only be interpreted, or an executable software code that has only to be loaded into the corresponding computer or control device for execution.

The electronically readable data medium can be, for example a DVD, a magnetic tape or a USB stick on which is stored electronically readable control information. When this control information is read from the data medium and stored in a control device or computer of a magnetic resonance system, all embodiments of the method described in the preceding can be implemented.

The present invention is particularly suitable for data acquisition in three-dimensional k-space in an MR measurement. Naturally, the present invention is not limited to this preferred field of application since the present invention could, for example, also be used in other imaging methods (for example x-ray computed tomography, positron emission tomography).

DESCRIPTION OF THE PREFERRED EMBODIMENTS

Figure 1:
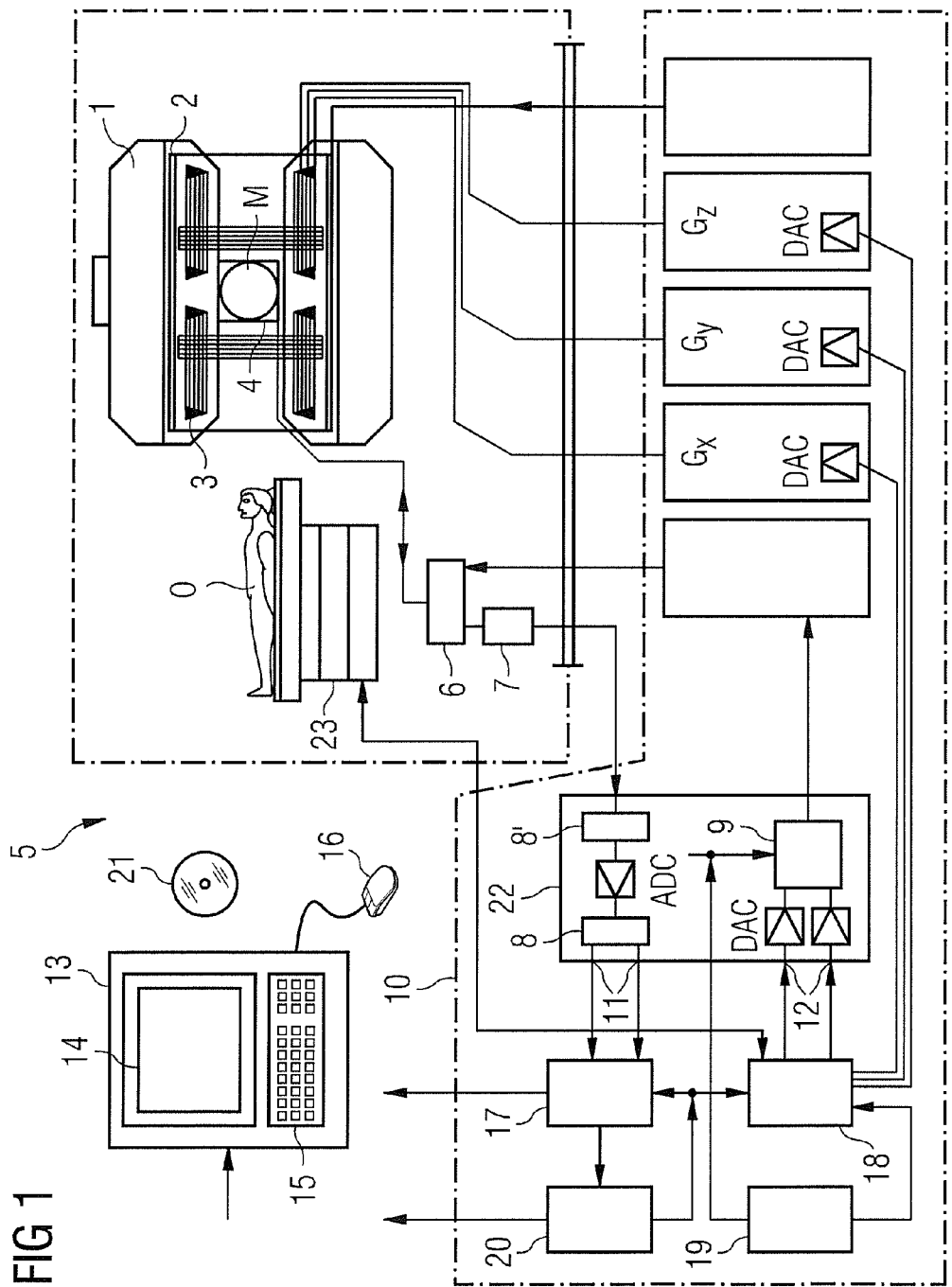
FIG. 1 depicts a magnetic resonance system according to the invention.

FIG. 1 is a schematic presentation of a magnetic resonance system 5 (of a magnetic resonance imaging or nuclear magnetic resonance tomography apparatus). A basic field magnet 1 generates a temporally constant, strong magnetic field for polarization or, respectively, alignment of the nuclear spins in a volume segment of an examination subject O, for example of a part of a human body that is to be examined, which part lies on a table 23 and is driven continuously into the magnetic resonance system 5 for examination or, respectively, measurement. The high homogeneity of the basic magnetic field that is required for the nuclear magnetic resonance measurement is defined in a typically spherical measurement volume M in which are arranged the parts of the human body that are to be examined. To support the homogeneity requirements, and in particular to eliminate temporally invariable influences, as shim plates made of ferromagnetic material are mounted at a suitable point. Temporally variable influences are eliminated by shim coils 2.

A cylindrical gradient coil system 3 which comprises three sub-windings is used in the basic field magnet 1. Each sub-winding is supplied by an amplifier with current to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier comprises a digital/analog converter which is controlled by a sequence controller 18 for time-accurate generation of gradient pulses.

Located within the gradient field system 3 is one (or more) radio-frequency antennas 4 which convert the radio-frequency pulses emitted by a radio-frequency power amplifier into an alternating magnetic field to excite the nuclei and align the nuclear spins of the subject O to be examined or of the region of the subject O that is to be examined. Each radio-frequency antenna 4 comprises one or more RF transmission coils and multiple RF reception coils in the form of an annular (advantageously linear or matrix-like) arrangement of component coils. The alternating field emanating from the precessing nuclear spins—i.e. normally the nuclear spin echo signals caused by a pulse sequence made up of one or more radio-frequency pulses and one or more gradient pulses—is also transduced by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore comprises a transmission channel 9 in which the radio-frequency pulses are generated for the excitation of the nuclear magnetic resonance. The respective radio-frequency pulses are represented digitally in the sequence controller 18 as a series of complex numbers. This number series is supplied as real part and imaginary part via respective inputs 12 to a digital/analog converter in the radio-frequency system 22, and from this to a transmission channel 9. In the transmission channel 9 the pulse sequences are modulated on a radio-frequency carrier signal whose base frequency corresponds to the center frequency.

The switch-over from transmission operation to reception operation takes place via a transmission/reception diplexer 6. The RF transmission coils of the radio-frequency antennas 4 radiate the radio-frequency pulses into the measurement volume M to excite the nuclear spins, and resulting echo signals are sampled via the RF reception coils. The correspondingly acquired nuclear magnetic resonance signals are phase-sensitively demodulated at an intermediate frequency in a reception channel 8' (first demodulator) of the radio-frequency system 22 and are digitized in the analog/digital converter (ADC). This signal is further demodulated to a frequency of 0. The demodulation to a frequency of 0 and the separation into real part and imaginary part occur after the digitization in the digital domain in a second demodulator 8. An MR angiography image or three-dimensional image data set is reconstructed by an image computer 17 from the measurement data acquired in such a manner. The administration of the measurement data, the image data and the control programs takes place via the system computer 20. Based on a specification with control programs, the sequence controller 18 controls the generation of the respective desired pulse sequences and the corresponding scanning of k-space. In particular, the sequence controller 18 controls the accurately-times switching (activation) of the gradients, the emission of the radio-frequency pulses with defined phase amplitude, and the reception of the nuclear magnetic resonance signals. The time base for the radio-frequency system 22 and the sequence controller 18 is provided by a synthesizer 19. The selection of corresponding control programs to generate an MR angiography image (which is stored on a DVD 21, for example) and the presentation of the generated MR angiography image take place via a terminal 13 which comprises a keyboard 15, a mouse 16 and a monitor 14.

Figure 2:
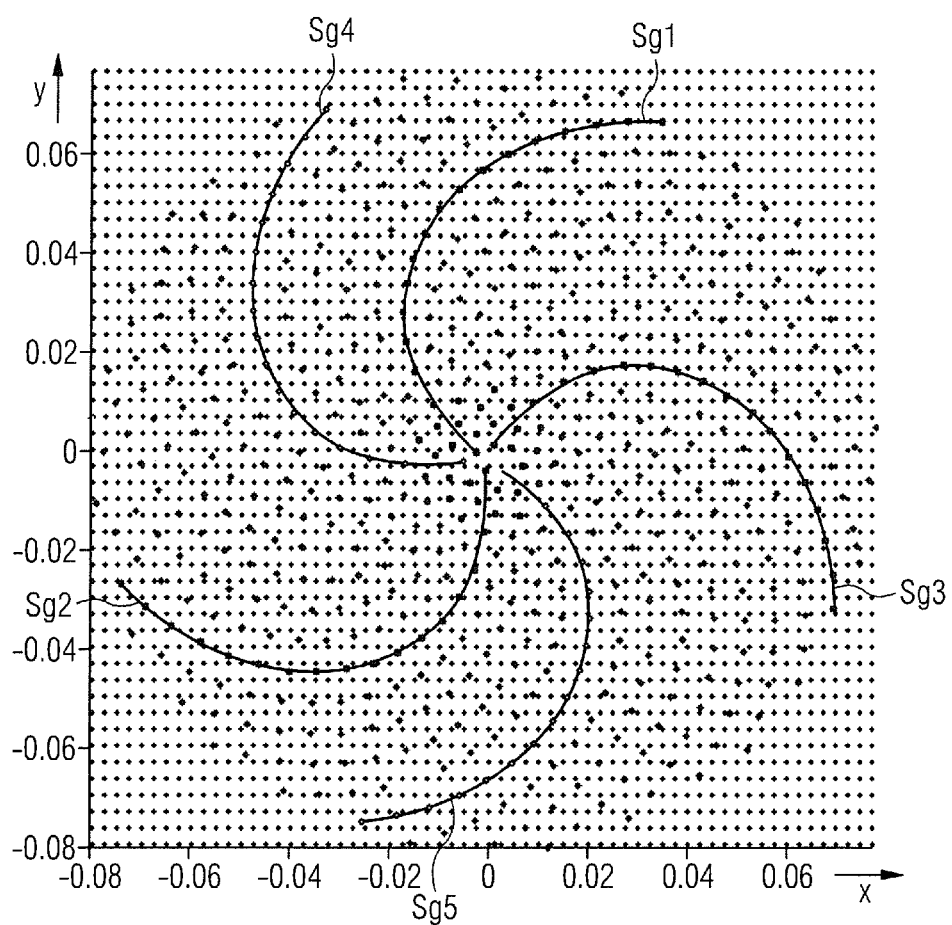
FIG. 2 shows all points according to a distribution according to the invention in the plane.

All points of the plane which serve to define the k-space lines to be scanned are shown. These points are respectively associated with one of 34 segments (the number of segments S accordingly amounts to 34), wherein the first five segments Sg1 through Sg5 are shown in FIG. 2. In the example shown in FIG. 2, the number of points per segment amounts to 17, such that 578 (34*17) points are shown in FIG. 2.

The first points of all segments (P[1,j]) thereby lie near a center point which is defined by the coordinates 0/0. The angle—which encloses the distance between the first point (P[1,n]) of the n-th segment (Sg1, for example) and this center point with the distance between the first point (P[1,n+1]) of the (n+1)-th segment (Sg2, for example) and this center point—thereby corresponds to the large golden angle.

Figure 3:
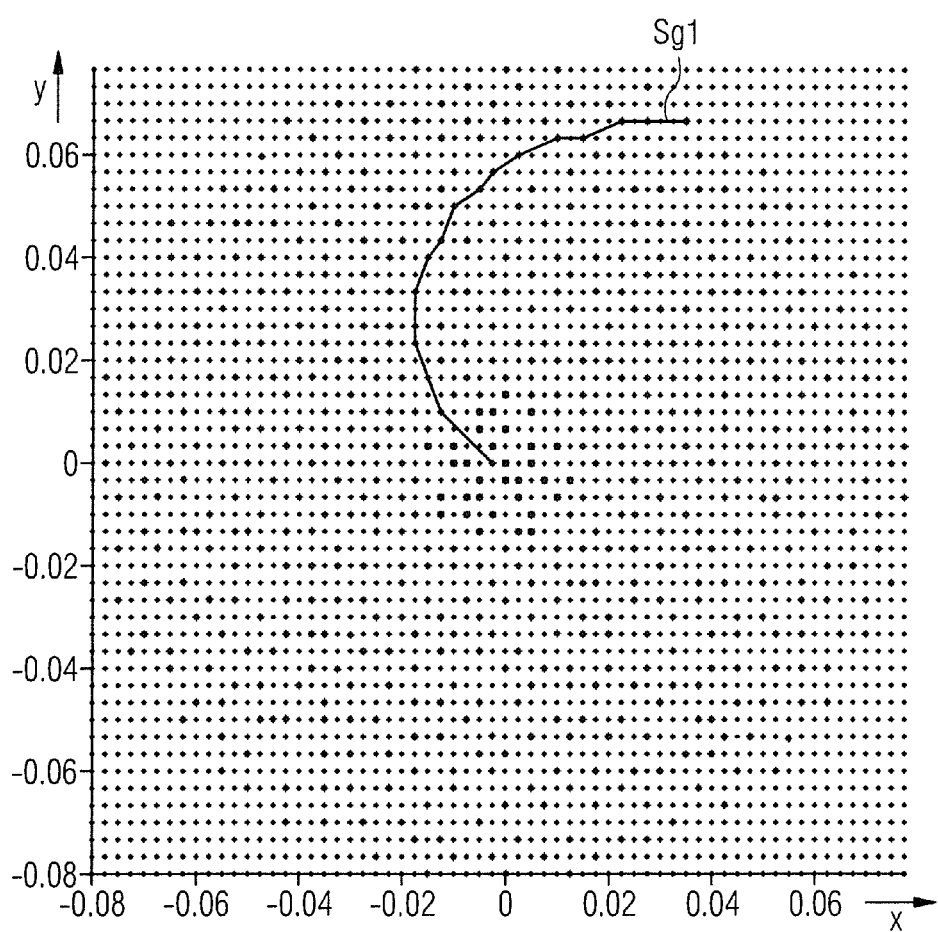
FIG. 3 shows the points depicted in FIG. 2, shifted to grid points.

In FIG. 3, the 578 points of FIG. 2 are shifted such that they respectively lie at the nearest grid point. Moreover, the first segment Sg1 is drawn in FIG. 3.

Figure 4:
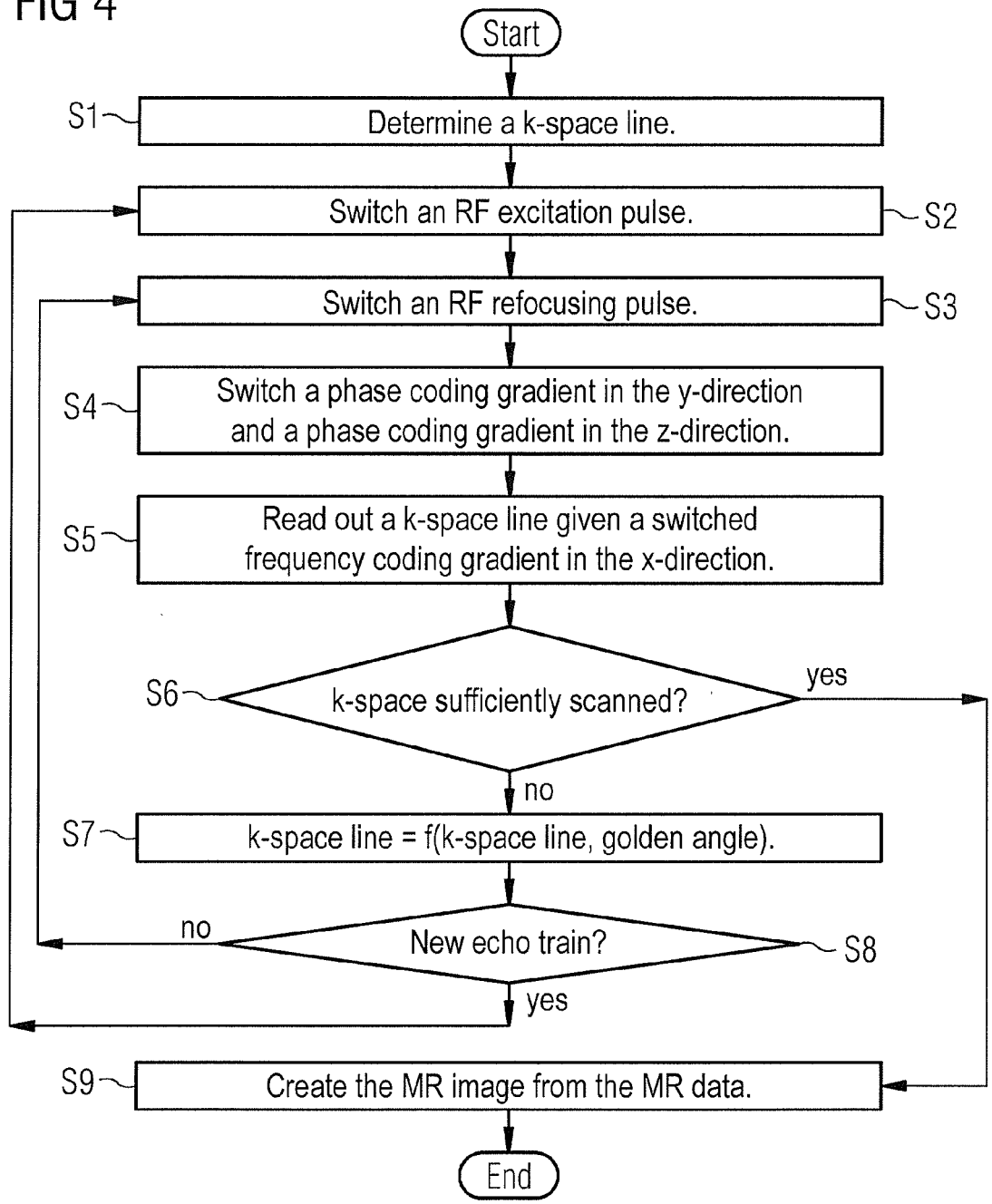
FIG. 4 is a flowchart of an embodiment of a method according to the invention for the generation of MR images of a three-dimensional volume.

An example of a workflow of a method according to the invention to create MR images is depicted in FIG. 4.

A k-space line which runs parallel to the z-axis is determined in a first Step S1.

An RF excitation pulse is switched in the following Step S2 and an RF refocusing pulse is subsequently switched in Step S3.

In Step S4, a phase coding gradient is subsequently switched in the y-direction and a phase coding gradient is switched in the z-direction, wherein the k-space points on the k-space line are subsequently read out in Step S5 given a switched frequency coding gradient in the x-direction. While the same frequency coding gradient is always switched in Step S5, in Step S4 the two phase coding gradients are set up such that, in a plane spanned by the y-axis and the z-axis, with said two phase coding gradients that k-space point is coded at which the current k-space line intersects this plane.

In the event that k-space is subsequently sufficiently scanned (query in Step S6), the method according to the invention branches to Step S9, in which the MR image is created based on the MR data acquired in k-space. In contrast to this, in the event that k-space has not yet been scanned sufficiently, in Step S7 the new current k-space line at which the MR data are then acquired in the next pass is determined with the golden angle, based on the still-current k-space line.

In the event that no new echo train is begun (meaning that the query S8 is answered in the negative), the method according to the invention branches to Step S3, in which an RF refocusing pulse is switched again. In contrast to this, in the event that a new echo train is begin (meaning that the query S8 is answered in the positive), the method according to the invention branches to Step S2, in which an RF excitation pulse is switched again.

For example, the y/z-plane can have 64 points in the z-direction and 128 (256) points in the y-direction, such that 64*128 (64*256) k-space lines would be to be acquired for complete scanning of k-space. Each k-space line thereby comprises 128, 256 or even 512 k-space points, such that 128, 256 or 512 k-space points are to be read out in a complete scanning of a k-space line. If the k-space lines are constructed by means of spiral phyllotaxis according to the invention, the acquisition of 10% of all possible k-space lines is then frequently sufficient in order to nevertheless create a qualitatively high-grade MR image via the iterative reconstruction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate a magnetic resonance (MR) image, comprising:
    operating an MR data acquisition unit to acquire MR data from a subject in the MR data acquisition unit, and entering said MR data into a memory representing three-dimensional k-space;
    entering said MR data into three-dimensional k-space along respective straight lines that are parallel to each other, each line being defined by a point in a plane that intersects each line and that is orthogonal to each line;
    organizing said points in said plane to conform to a distribution of said points that obeys spiral phyllotaxis; and
    in a processor, reconstructing an MR image of the subject from said MR data entered into three-dimensional k-space, and making said MR image available as a data file at an output of said processor.

2. A method as claimed in claim 1 comprising organizing said points in said plane with said distribution of said points obeying Fibonacci phyllotaxis.

3. A method as claimed in claim 1 comprising:
    defining said straight lines in three-dimensional k-space by a grid in said plane that comprises both first straight lines proceeding in parallel in a first direction, and second straight lines proceeding in parallel in a second direction, said first straight lines being orthogonal to said second straight lines, and a first distance between adjacent first straight lines being constant and a second distance between adjacent second straight lines being constant, and said grid comprising grid points each corresponding to an intersection point of one of said first straight lines with one of said second straight lines; and
    defining said points in said plane by determining, in said processor, a nearest grid point among said grid point among said grid points of said grid for each point in said plane, and a corresponding line of the respective point that proceeds through said grid.

4. A method as claimed in claim 1 comprising:
    operating said MR data acquisition unit to acquire said MR data by activating two phase coding gradients and a frequency coding gradient, with said phase coding gradients and said frequency coding gradients being alternately situated orthogonally to each other; and said frequency coding gradient proceeding along said lines in three-dimensional k-space.

5. A method as claimed in claim 1 comprising:

generating said MR image in said processor by implementing an iterative reconstruction algorithm in said processor in which information represented by unacquired MR data of a volume segment of said subject is supplemented by prior knowledge about the MR image to be generated.

6. A method as claimed in claim 5 comprising, in said processor, implementing said iterative reconstruction algorithm using a sparsity of image information within the MR data.

7. A method as claimed in claim 1 comprising:

organizing said points in said plane to cause said distribution of said points to obey Fibonacci phyllotaxis defined by a Fibonacci sequence;

entering said MR data into three-dimensional k-space in respective segments in each of said lines; and selecting a number of segments in each line to correspond to an element of said Fibonacci sequence or a sum of two elements of said Fibonacci sequence.

8. A method as claimed in claim 7, comprising:

the points in the plane are calculated as polar coordinates $R[i,j]$ and $\phi[i,j]$ according to $$R[i,j] = F_1 \times (i+(j-1) \times S)^{(0.5+F_2)}$$

$$\phi[i,j] = (i+(j-1) \times S) \times \Psi$$

wherein j is an index that indicates to which segment the respective point belongs, which begins at 1, i is an index of the points within a segment, which begins at 1, $R[i,j]$ defines a radius that has the distance of the point defined by the indices i and j from a center point, the center point is an intersection point of a middle axis of k-space, which is orthogonal to the plane, with the plane, $\phi[i,j]$ is an angle that a radius of the point defined by the indices i and j has relative to a ray that lies in the plane and intersects with the center point, $\psi$ is the golden angle, S is a number of segments into which said MR data are entered in the lines defined by the points, $F_1$ is a constant that is dependent on an element of the Fibonacci sequence or a sum of two elements of the Fibonacci sequence, and $F_2$ is a constant.

9. A method as claimed in claim 8 comprising, in said processor:

calculating $F_1$ according to $$F_1 = \left(\frac{N}{B}\right)^{-(0.5+F_2)}, \tag{5}$$

wherein N is a total number of all k-space lines that are encompassed by an ellipse in k-space that is defined by a maximum radius in the respective direction in k-space, and B is an acceleration factor.

10. A magnetic resonance (MR) apparatus comprising:

an MR data acquisition unit;

a control unit configured to operate said MR data acquisition unit to acquire MR data from a subject in the MR data acquisition unit, and to enter said MR data into a memory representing three-dimensional k-space;

said control unit being configured to enter said MR data into three-dimensional k-space along respective straight lines that are parallel to each other, each line being defined by a point in a plane that intersects each line and that is orthogonal to each line;

said memory being configured with said points in said plane conforming to a distribution of said points that obeys spiral phyllotaxis; and a processor configured to reconstruct an MR image of the subject from said MR data entered into three-dimensional k-space, and to make said MR image available as a data file at an output of said processor.

11. A non-transitory, computer-readable data storage medium encoded with programming instructions that, when said storage medium is loaded into a computerized control and processing system of a magnetic resonance (MR) apparatus, which also comprises an MR data acquisition unit, cause said computerized control and evaluation system to:

operate said MR data acquisition unit to acquire MR data from a subject in the MR data acquisition unit, and entering said MR data into a memory representing three-dimensional k-space;

enter said MR data into three-dimensional k-space along respective straight lines that are parallel to each other, each line being defined by a point in a plane that intersects each line and that is orthogonal to each line;

enter said points in said plane to so as to conform to a distribution of said points that obeys spiral phyllotaxis; and reconstruct an MR image of the subject from said MR data entered into three-dimensional k-space, and make said MR image available as a data file at an output of said processor.

\* \* \* \* \*